United States Patent [19]
Hsueh et al.

[11] Patent Number: 5,179,297
[45] Date of Patent: Jan. 12, 1993

[54] CMOS SELF-ADJUSTING BIAS GENERATOR FOR HIGH VOLTAGE DRIVERS

[75] Inventors: Kelvin K. Hsueh; Brian R. Kauffmann; Gerardus F. Riebeek, all of Pocatello, Id.

[73] Assignee: Gould Inc., Eastlake, Ohio

[21] Appl. No.: 601,892

[22] Filed: Oct. 22, 1990

[51] Int. Cl.⁵ .............................................. H02J 1/04
[52] U.S. Cl. ............................ 307/296.6; 307/296.1; 307/296.7; 307/270; 307/451; 307/585
[58] Field of Search ............... 307/296.1, 296.6, 296.7, 307/296.8, 270, 451, 585

[56] References Cited
U.S. PATENT DOCUMENTS

| | | | |
|---|---|---|---|
| 4,323,794 | 4/1982 | Hoehn | 307/296.6 |
| 4,323,795 | 4/1982 | Holloway et al. | 307/296.6 |
| 4,342,926 | 8/1982 | Whatley | 307/296.8 |
| 4,374,357 | 2/1983 | Olesin et al. | 307/296.8 |
| 4,419,594 | 12/1983 | Gemmel et al. | 307/296.6 |
| 4,490,629 | 12/1984 | Barlow et al. | 307/451 |
| 4,593,208 | 6/1986 | Single | 307/296.7 |
| 4,817,055 | 3/1989 | Arakawa et al. | 307/296.2 |
| 4,843,256 | 6/1989 | Scade et al. | 307/296.2 |
| 4,899,114 | 2/1990 | Berhmer et al. | 307/359 |
| 5,034,625 | 6/1991 | Min et al. | 307/296.1 |

Primary Examiner—John S. Heyman
Assistant Examiner—Scott A. Ouellette
Attorney, Agent, or Firm—Renner, Otto, Boisselle & Sklar

[57] ABSTRACT

In a high-voltage output buffer, a self-adjusting bias generator is provided which is capable of automatically adjusting the applied bias voltages in the output buffer so as to enhance the output buffer performance. Under normal or high supply voltage conditions, the bias generator provides a first set of bias voltages to the series-connected transistors in the output buffer. Under low supply voltage conditions, the bias generator provides a second set of bias voltages to the various series-connected transistors.

27 Claims, 4 Drawing Sheets

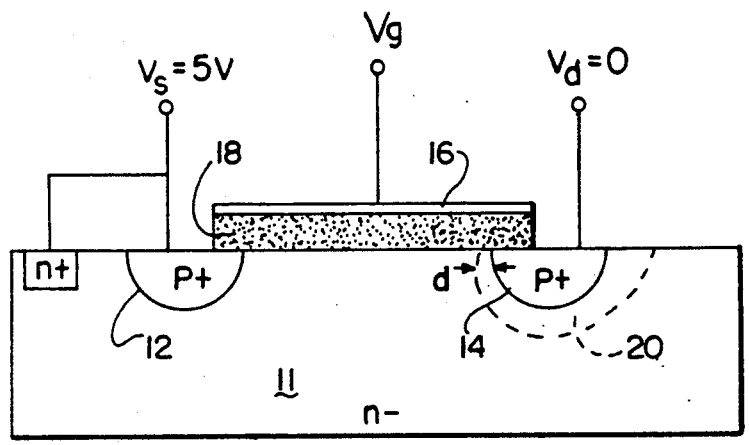
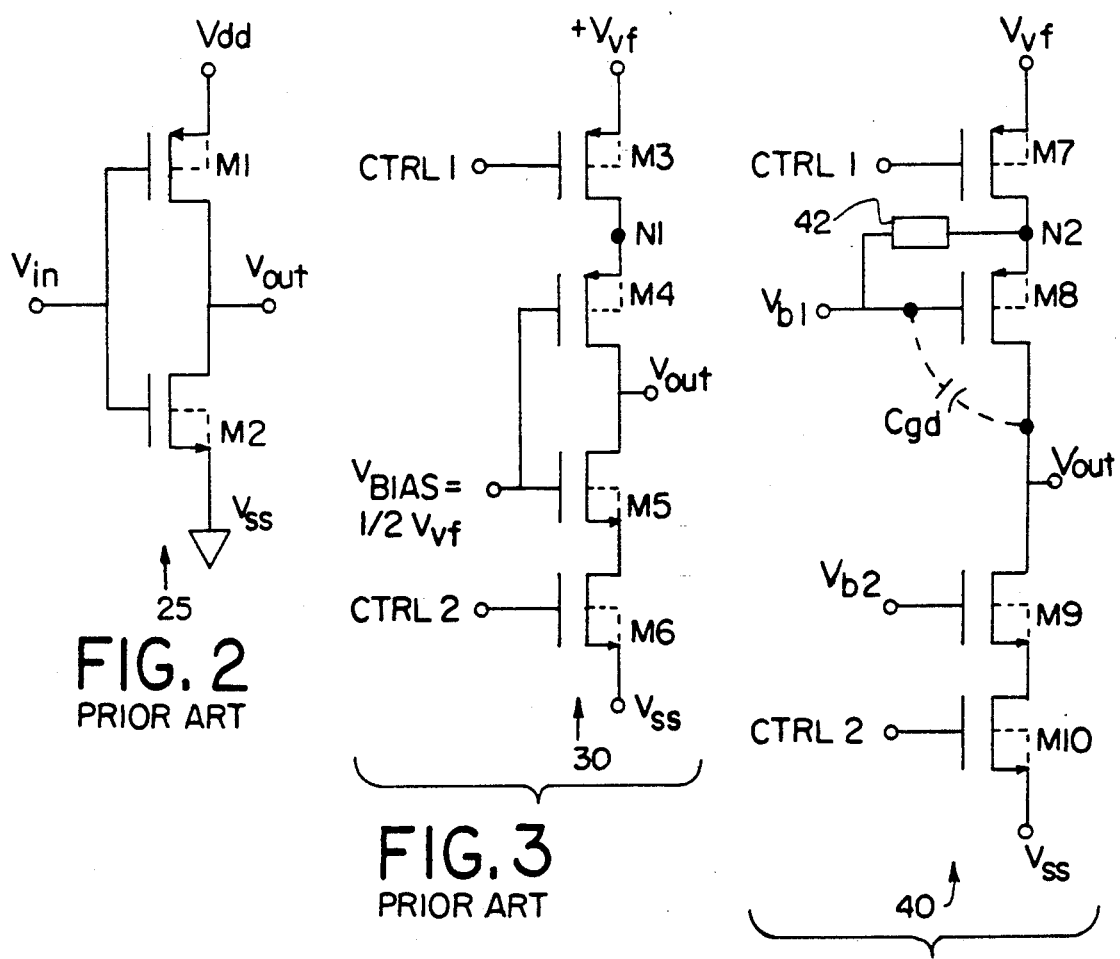

CMOS SELF-ADJUSTING BIAS GENERATOR FOR HIGH VOLTAGE DRIVERS

TECHNICAL FIELD

The present invention relates generally to integrated circuit devices, and more specifically, to high-voltage complementary metal oxide semiconductor (CMOS) integrated circuit devices. Even more particularly, the present invention relates to a high-voltage CMOS output buffer and associated bias generator, each of which may be fabricated using standard CMOS technology.

BACKGROUND OF THE INVENTION

Metal-oxide-semiconductor field effect transistors (MOSFETs) are known in the art. FIG. 1 shows a cross-section of a typical P-channel MOSFET device 10 which includes a lightly doped N-type substrate 11. Two highly doped P+ regions 12 and 14 are diffused or implanted into the substrate 11 to form a source and drain, respectively, as is known in the art. The P+ region 12 serves as a source through which majority carriers ("holes" in the case of a P-channel device, or, alternatively, electrons in the case of an N-channel device) enter the MOSFET device 10. The P+ region 14 serves as a drain through which the majority carriers, i.e., holes, exit the MOSFET device 10. A voltage bias $V_g$, which is applied at the gate 16 of the MOSFET device 10, controls the amount of current flow of the majority carriers through the MOSFET device 10 between the source 12 and the drain 14. More specifically, the gate 16 in conjunction with a dielectric oxide layer 18 and the substrate 11 form a parallel plate capacitor, such that, by applying an appropriate gate voltage $V_g$ to the gate 16, an induced charge is created within a channel region of the substrate 11 located between the source 12 and drain 14 of the MOSFET device 10. As the gate voltage $V_g$ increases, so does the magnitude of the induced charge. As a result, the conductivity of the substrate 11 between the source 12 and drain 14 increases, and current is permitted to flow through the induced channel when a proper drain voltage is presented as is known.

When utilizing a P-channel MOSFET device, both the source 12 and substrate 11 typically are connected to the source voltage $V_s$. The drain 14 is connected to the drain voltage $V_d$ which is at a lower potential than the source voltage $V_s$. Thus, when the gate voltage $V_g$ is negative in relation to the source voltage $V_s$, a positive charge is induced within the substrate 11 adjacent the dielectric layer 18. As is explained above, the induced positive charge creates a channel between the source 12 and drain 14 through which the majority carriers are permitted to travel, therefore resulting in current flow within the device 10.

An N-channel device is analogous to its P-channel counterpart described above. The N-channel device comprises a lightly doped P− type substrate into which two highly doped N+ type regions are diffused or implanted to form the source and drain. In the case of an N-channel device, an appropriate applied gate voltage $V_g$ will cause a negative induced charge to form between the N+ type source and drain. This negative induced charge permits the majority carriers, i.e., the electrons, to travel between the source and drain. Like the P-channel device, the substrate of the N-channel MOSFET device is typically connected along with the source region to the source voltage $V_s$. The drain voltage $V_d$, on the other hand, is at a higher potential than the source voltage $V_s$. As a result, when a gate voltage $V_g$ is applied which is positive with respect to the source voltage $V_s$, current is permitted to flow through the N-channel device.

Therefore, a MOSFET device, whether a P-channel or N-channel type, is commonly referred to as being turned "on" when the appropriate drain and gate biases $V_g$ and $V_d$ are present such that current is permitted to travel between source 12 and drain 14. When the appropriate gate and drain bias voltages are not present, the device is commonly referred to as being "off", due primarily to the very large impedance presented by the substrate 11 between the source 12 and drain 14.

As is described in detail in commonly assigned U.S. Pat. No. 4,490,629 entitled "High Voltage Circuits in Low Voltage CMOS Process", when the MOSFET device 10 is off and the drain 14 is connected through an external load device (not shown) to ground, a depletion region 20 in which the free majority charge carriers are depleted forms in the substrate 11 around the drain 14 as is shown in FIG. 1. Electrons are forced away from the drain 14 due to its relatively low voltage with respect to the substrate 11, which, as was previously described, is connected to a relative positive voltage $V_s$ in the case of a P-channel device. As the voltage difference between the drain 14 and the substrate 11 increases, the width of the depletion region increases, as is known in the art. However, as is shown in FIG. 1, the gate 16 of the P-channel device causes electrons to be attracted near the gate-substrate-drain interface. The influence of the gate voltage $V_g$ tends to force the electric fields to taper in near the edge of the drain at the gate interface. As is known in the art, this pinching or narrowing of the depletion region near the gate causes a reduction in the width of the depletion region to a width d.

Thus, for an increasing voltage differential between the drain 14 and the substrate 11, the effect of the gate voltage $V_g$ at the gate-drain interface results in a decreased depletion width d in which the electric field between the drain 14 and the substrate 11 increases in the area close to the surface. This forms the weakness for conventional MOSFET devices in high voltage applications. When the electric field between the drain 14 and the substrate 11 becomes sufficiently high, due to a high drain voltage $V_d$ for example, the PN junction formed between drain the 14 and the substrate 11 breaks down under reverse-bias and current flows from the substrate 11 to the drain 14 near the gate interface. This phenomenon is hereinafter referred to as drain to bulk reverse-bias breakdown.

A more detailed description of the reverse-bias breakdown phenomenon is provided in the '629 patent. The entire disclosure of U.S. Pat. No. 4,490,629 is hereby incorporated by reference.

For the reasons explained above, the reverse-bias breakdown voltage of a P-channel or N-channel MOSFET device 10 is an important parameter to consider when designing high voltage switching circuitry using CMOS technology. For example, FIG. 2 shows a conventional CMOS inverter 25 which provides an output voltage $V_{out}$ which is equal to either the voltage indicated as $V_{dd}$ or the voltage indicated as $V_{ss}$, depending on the applied input voltage $V_{in}$. As is shown in FIG. 2, input voltage $V_{in}$ is applied to the respective gates of devices M1 and M2. When the input voltage $V_{in}$ is a logic 1 (typically 5 volts), the P-channel device designated M1 turns off while the N-channel device designated M2 turns on. Therefore, the MOSFET device M1 exhibits a very high impedance, whereas, the device M2 exhibits a very low impedance, thus allowing current to flow only through the device M2. As a result, the output voltage $V_{out}$ is pulled down to what is sometimes referred to as the $V_{ss}$ rail, and the output voltage $V_{out}$ therefore assumes the value of $V_{ss}$. In the alternative, when the input voltage $V_{in}$ is a logic 0 (typically 0 volts), device M1 turns on and device M2 turns off, thereby causing the output voltage $V_{out}$ to be pulled up to the value of voltage $V_{dd}$.

Regardless of whether the output voltage $V_{out}$ is equal to voltage level $V_{dd}$ or $V_{ss}$ at a particular moment in time, the MOSFET device in inverter 25 which happens to be off at that moment is subjected to a reverse bias voltage of approximately $V_{dd}$, where $V_{ss}$ is considered to be digital ground. In the event voltage $V_{dd}$ is a substantially high voltage, the reverse bias voltage which will be imposed across the particular MOSFET device could result in a reverse bias breakdown of the device in the manner described above.

The '629 patent describes a CMOS high voltage push-pull output buffer which is designed to prevent high voltages from being applied across a given MOSFET device so as to avoid the occurrence of bulk to drain reverse-bias breakdown. The '629 patent describes an output buffer in which a number of P-channel and N-channel devices are connected in source-to-drain series such that the voltage which is to be switched by the output buffer becomes evenly distributed across each series connected device, thus avoiding a large voltage being applied across a given device and resultantly increasing the switching capability of the overall circuit.

Referring now to FIG. 3, shown is a high voltage output buffer in accordance with the teachings of the '629 patent. In FIG. 3, P-channel devices designated M3 and M4 are connected in source-to-drain series with the similarly connected N-channel devices designated M5 and M6, forming a high voltage output buffer 30. As described in the '629 patent, gate voltages for the P-channel and N-channel devices are selected such that the relatively high supply voltage $V_{vf}$ substantially equally divides across the series connected P-channel devices in the event the P-channel devices are off and the N-channel devices are on. Alternatively, the high supply voltage $V_{vf}$ substantially equally divides across the series connected N-channel devices when the N-channel transistors are off and the P-channel devices on. In this manner, large reverse bias voltages across the MOSFET devices tend to be avoided.

As an example, when a logic 1 signal is applied to the control inputs designated CTRL1 and CTRL2, devices M5 and M6 are turned on while devices M3 and M4 are turned off, resulting in output voltage $V_{out}=V_{ss}$. As is taught in the '629 patent, with a bias voltage (from an appropriate source) of $V_{bias}=0.5\ V_{vf}$ applied to the gate of device M4, the source of device M4 will tend to remain at a voltage of approximately $0.5\ V_{vf}+V_t$, where $V_t$ is the threshold voltage of the MOSFET device. Meanwhile, the voltage at the source of device M3 will tend to remain at the value of supply voltage $V_{vf}$ as is shown in FIG. 3. As a result, the supply voltage $V_{vf}$ becomes substantially equally divided across each respective source to drain of the P-channel devices M3 and M4. More specifically, the voltage across each of the MOSFET devices which remain off is equal to one-half $V_{vf}$.

Alternatively, in the case where a logic 0 control input signal is applied to control lines CTRL1 and CTRL2, devices M3 and M4 turn on and devices M5 and M6 turn off, thereby causing the output voltage $V_{out}$ to switch or be pulled up to the level of supply voltage $V_{vf}$. The voltage at the drain of device M5 becomes that of the output voltage $V_{out}$, or approximately the supply $V_{vf}$. The voltage at the source of M5 remains at a value of approximately $0.5\ V_{vf}-V_t$, which corresponds to the source to drain voltage across device M6. In this case, therefore, the supply voltage designated $V_{vf}$ will be substantially equally divided across devices M5 and M6. As in the above case, the magnitude of the voltage across a given MOSFET device is limited to that of $0.5\ V_{vf}$.

According to the exemplary embodiment shown in FIG. 3, where two P-channel and two N-channel devices are connected in series, a single bias voltage applied to the gates of M3 and M4 is sufficient to enable the supply voltage $V_{vf}$ to be substantially equally divided across the P-channel devices M3 and M4 when they are off, and alternatively, across the N-channel devices M5 and M6 in the event they are off. As described in the '629 patent, the appropriate bias voltage $V_{bias}$ for the embodiment shown in FIG. 3 is $V_{bias}=0.5\ V_{vf}$. This bias voltage is applied to the gates of both the P-channel device M4 and the N-channel device M5. Because an identical bias voltage ordinarily is applied to devices M4 and M5, in order that the supply voltage $V_{vf}$ will substantially equally divide across either the P or N-channel devices, M4 and M5 are referred to herein as forming a corresponding P-channel and N-channel pair.

More generally, a P-channel device and an N-channel device in the series-connected stack are referred to herein as forming a corresponding pair when an approximately equal bias voltage is applied to the respective gate in each of the devices in the pair in order that the output voltage $V_{out}$ becomes substantially equally divided across either the series-connected P-channel device or the N-channel device in the output buffer. The embodiment shown in FIG. 3 includes the corresponding pair of devices M4 and M5.

In an output buffer such as that shown in FIG. 3 of the drawings of the '629 patent, the output buffer may include three P-channel devices and three N-channel devices connected in series. In such an embodiment having three of each type of devices connected in series, two separate corresponding pairs are formed, each including a single P-channel and N-channel device. A bias voltage of $\frac{1}{3}\ V_{vf}$ is applied to the gates of a first P-channel device and a first N-channel device which make up a first corresponding pair. A bias voltage of $\frac{2}{3}\ V_{vf}$ is applied to the gates of a second P-channel device and a second N-channel device in the series connection which in turn make up a second corresponding pair. In the teachings of the '629 patent, a single bias line is utilized to provide the voltage to each gate in the corresponding pair.

While the exemplary prior art output buffer 30 shown in FIG. 3 utilizes two P-channel and two N-channel devices connected in series, other prior art embodiments included additional series-connected MOSFET devices so that the voltage across a given individual device was further reduced. As is taught in the '629 patent, in the event additional devices were connected in series, appropriate bias voltages which were typically approximately equal to integer fractions of $V_{yf}$, were applied in a similar fashion to that described above to the gates of the additional corresponding pairs of P-channel and N-channel devices. The exact number and values of the additional bias voltages depended on the number of MOSFET devices which were connected in series in the output buffer 30. Therefore, while the background of the invention as well as the invention itself is described herein as involving primarily a high voltage output buffer having only two P-channel and two N-channel devices connected in series, it will be appreciated that such a configuration is intended to be merely exemplary. The various aspects of the present invention equally apply to high voltage output buffers having additional series connected devices with related bias voltages. As a result, the scope of the present invention is not intended to be limited to that of the exemplary embodiment.

As is evident in the above example, the '629 patent describes a push-pull output buffer 30 capable of switching high voltages using standard CMOS technology and/or processes. Complex fabrication processes for increasing the bulk to drain reverse bias breakdown voltage of the individual MOSFET devices are not required. The buffer 30 employs a plurality of P and N-channel devices connected in series in addition to appropriate gate biasing in order to distribute evenly the voltage across each device so that reverse bias breakdown voltage of each device may be avoided, even in the presence of high voltages.

There have been, however, a number of drawbacks associated with high-voltage output buffers of the type described in the '629 patent. For example, the voltages at the nodes between the series connected devices have been found to drift upon a switching of the output voltage $V_{out}$. More specifically, a drift voltage node has been observed, for example, at a location indicated as node N1 of the output buffer 30, as is shown in FIG. 3. As is explained in detail below, such voltage drift at node N1 can stress the gate at the drain end of device M3. Under high voltage conditions, this stress can eventually lead to the failure of device M3 as well as the entire circuit 30. As an example, such stress related problems have often been found to arise in those applications in which the supply voltage $V_{yf}$ is greater than 30 volts.

Another problem which has been associated with prior high-voltage output buffers has been their inability to source sufficient current under low $V_{yf}$ conditions, for example, $V_{yf} \leq 8$ volts. In the exemplary output buffer shown in FIG. 3, the sourcing ability of each MOSFET device is proportional to its gate bias, or $V_{gs} - V_t$, where $V_{gs}$ is the gate to source voltage of the device and $V_t$ is its threshold voltage. Because the gate to source voltage $V_{gs}$ of each device is dependent on the value of the supply voltage $V_{yf}$, the sourcing ability of these devices has been found to suffer under low $V_{yf}$ conditions. In the past, the above problem has been dealt with by increasing the size of each MOSFET device, thus increasing the channel width of each device so that a greater number of majority charge carriers are enabled to travel under low supply voltage $V_{yf}$ conditions. However, this increase in the size of each MOSFET device resulted, unfortunately, in both the inefficient use of the substrate 11 and in the increased cost of the output buffer.

Related to the inability of output buffers in the past to source sufficient current under low $V_{yf}$ voltage conditions was their restricted switching speed. More specifically, because the gate voltage typically applied was insufficient to turn the respective device fully "on", each device represented a relatively large impedance even in the "on" condition. This large impedance hindered the switching response time of the output buffer, as will be appreciated by one of ordinary skill in the art.

Yet another problem associated with such prior high-voltage output buffers has been the problem of noise on one or more of the bias lines. Oftentimes, multiple high-voltage output buffers 30 were driven by the same bias lines, these bias lines providing the appropriate bias voltages to similar corresponding pairs of P and N-channel MOSFETS. However, when the output voltage $V_{out}$ would be switched, for example, in a single output buffer with respect to the other output buffers 30 sharing the same bias line, the parasitic coupling occurring in the MOSFET devices in the switching buffer 30 tended to cause the voltage on the individual bias line or lines to be pulled up or down. As a result, it is evident that the effect of other output buffers 30 switching would be seen as noise on the bias line for a given high voltage output buffer 30.

Still another problem associated with previous high-voltage output drivers was the limitations of the bias generator in each driver. As is described above, such a bias generator often consisted solely of a voltage divider network comprising a stack of MOSFET devices. Of course, in the event it would have been desirable for the bias voltage to be changed to a different value, such a prior bias generator was incapable of implementing the change since the divider ratio was permanently established. As a result, such a prior bias generator was not capable of automatically changing the voltage provided along the bias line in the event such a change was determined to be desirable.

Yet another limitation of such a previous bias generator was that the impedance on the bias line from the midpoint of the voltage divider was relatively large. This was due primarily to the fact that the two stacked MOSFET devices themselves presented such an impedance, as would a traditional resistive voltage divider. As a result, the bias line from such a bias generator tended to be somewhat noisy since, because of the relatively high impedance, there was nowhere for noise coupled onto the line to be shunted away. Such a noise problem would then be compounded when a lower supply voltage was utilized, as is known in the art.

Thus, there remains a strong need in the art for a method and apparatus for providing a highly stable high-voltage output buffer using conventional CMOS technology. More specifically, there remains a strong need for a method and apparatus for reducing or eliminating the problems caused by drift voltage nodes in a high-voltage output buffer without requiring elaborate processing of the CMOS device.

Furthermore, there is a need for a high-voltage output buffer which is capable of sourcing the necessary current under low $V_{yf}$ voltage conditions, without having to increase the size of the output device. In addition, there remains a strong need for a high-voltage output buffer capable of operating at a high switching speed. Even more, there remains a strong need for a high-voltage output buffer whose performance at low voltages is comparable to its performance at high voltages.

In addition, there remains a strong need for a high-voltage output buffer which may share one or more common bias lines with other of such output buffers while reducing the noise occurring along the shared bias lines.

Moreover, there remains a strong need for a self-adjusting CMOS bias generator which is capable of providing the desired bias voltages to the MOSFET devices in the high-voltage output buffer in accordance with the present invention. Such bias voltages may be equal to one value under low supply voltage $V_{yf}$ conditions, and equal to another value under normal or high supply voltage $V_{yf}$ conditions. Furthermore, there remains a strong need for a bias generator which is less susceptible to having noise on the bias line than as was found in the previous bias generators.

SUMMARY OF THE INVENTION

Accordingly, the present invention has been developed to overcome the foregoing shortcomings of existing CMOS high-voltage output buffers, and more specifically, the foregoing shortcomings of existing CMOS bias generators utilized in CMOS high-voltage output buffers.

In the present invention, there is provided a highly stable high-voltage output buffer and self-adjusting bias generator which may be manufactured using standard CMOS technology and in which the effects of voltage drift at one or more nodes between series connected P or N-channel MOSFET devices are greatly reduced or eliminated. In addition, the present invention provides a method and apparatus for increasing the current sourcing capability of a CMOS high-voltage output buffer, even under low supply $V_{yf}$ conditions, without necessarily increasing the size of the output device. The invention includes a self-adjusting bias generator which, dependent upon the value of the supply voltage $V_{yd}$, optimizes the performance of the output buffer. Furthermore, the present invention provides a method and apparatus for reducing the effects of coupling along a shared bias line between a plurality of high-voltage output buffers in accordance with the present invention.

In accordance with one aspect of the present invention, there is provided a self-adjusting bias generator, which includes a plurality of bias line outputs, each of which provides a bias voltage thereat; and automatic means for adjusting at least one of the bias voltages between a first output state and a second output state based on the magnitude of a reference voltage.

In accordance with another aspect there is provided a self-adjusting bias generator which includes a plurality of bias line outputs, each of which provide a bias voltage thereat; means for comparing a first reference voltage to a second reference voltage; and automatic means for adjusting at least one of the bias voltages between a first output state and a second output state based on the comparison.

In accordance with yet another aspect there is provided a self-adjusting bias generator, the bias generator including a plurality of bias line outputs, at least one of which is capable of assuming one or more different bias levels representing different respective output states; and means for adjusting the bias voltage on at least one bias line between the different output states based on the magnitude of a reference voltage.

In accordance with still another aspect of the present invention, there is provided a self-adjusting bias generator, the bias generator including a plurality of bias voltage outputs, at least one of which is capable of assuming one or more different bias levels representing different respective output states; means for comparing a first reference voltage to a second reference voltage; and means for switching the bias level on at least one bias voltage output to a level representing a first state when the first reference voltage is greater than the second reference voltage, and for switching the bias level to a level representing a second state when the first reference voltage is less than the second reference voltage.

In accordance with a further aspect there is provided a high-voltage CMOS push-pull output buffer including a plurality of P-channel transistors and a plurality of N-channel transistors connected in series; separate bias lines for providing a bias voltage to the respective gates of a corresponding P-channel and N-channel pair of transistors in the series connected transistors; and a self-adjusting bias generator, wherein the bias generator comprises plural bias voltage outputs for providing the bias voltages to the bias lines, and automatic means for adjusting the magnitude of at least one of the bias voltages between a first output state and a second output state.

In accordance with a still further aspect of the present invention, there is provided a high-voltage CMOS push-pull output buffer including a plurality of P-channel transistors and a plurality of N-channel transistors connected in series; separate bias lines for providing a bias voltage to the respective gates of a corresponding P-channel and N-channel pair of transistors in the series connected transistors; and a self-adjusting bias generator, wherein the bias generator comprises plural bias voltage outputs for providing the bias voltages to the bias lines, at least one of the outputs being capable of assuming one or more different bias levels representing different respective output states; and means for comparing a first reference voltage to a second reference voltage; means for switching the bias level on the at least one bias voltage output to a level representing a first state when the first reference voltage is greater than the second reference voltage; and for switching the bias level to a level representing a second state when the first reference voltage is less than the second reference voltage.

These and other aspects, features, and embodiments of the invention will become apparent as the following description proceeds.

To the accomplishment of the foregoing and related ends, the invention, then, comprises the features hereinafter fully described and particularly pointed out in the claims, the following description and the annexed drawings setting forth in detail certain illustrative embodiments of the invention, these being indicative, however, of but a few of the various ways in which the principles of the invention may be employed.

While the present invention is described with reference to a particular embodiment, the invention is not limited to the specific examples given, and other embodiments and modifications can be made by those skilled in the art without departing from the spirit and scope of the invention. It will be appreciated that the scope of the invention is determined by the claims and equivalents thereof.

BRIEF DESCRIPTION OF THE DRAWINGS

In the annexed drawings:

FIG. 1 is a cross-sectional view of a metal-oxide-semiconductor device as is known in the art;

FIG. 2 is a schematic representation of a conventional CMOS inverter as is known in the art;

FIG. 3 is a schematic diagram of a CMOS high-voltage push-pull output buffer as is known in the art;

FIG. 4 is a schematic diagram of a CMOS high-voltage push-pull output buffer including a compensation device in accordance with the present invention;

DETAILED DESCRIPTION OF THE PREFERRED EMBODIMENT

Figure 5A:
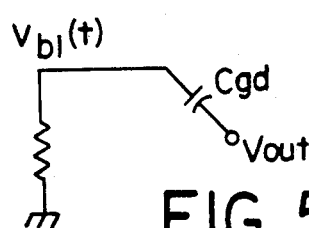
FIGS. 5A and 5B are schematic diagrams which model a feedback effect within a CMOS high-voltage output buffer in accordance with the present invention.

Referring now to FIG. 4, a highly stable high-voltage output buffer 40 in accordance with the present invention is shown. The output buffer 40 includes two P-channel MOSFET devices M7 and M8 which are connected in series with two N-channel MOSFET devices M9 and M10, as is described above, and further includes a compensation device 42. The output voltage $V_{out}$ is located at the node between the series connected drains of the P-channel device M8 and the N-channel device M9. The control inputs CTRL1 and CTRL2 are located at the gates of devices M7 and M10, respectively. A separate set of bias lines $V_{b1}$ and $V_{b2}$ are provided to the gates of devices M8 and M9, respectively, and serve to provide the appropriate bias voltages from a bias generator (not shown) as is described in further detail below.

The compensation device 42 utilized in the present invention to reduce or eliminate any voltage swing along the bias lines $V_{b1}$ and $V_{b2}$. In addition, the compensation device 42 is utilized to reduce or to eliminate the effects of voltage drift which may occur, for example, at the node designated N2 in the output buffer 40. As is mentioned above, the voltages at the various nodes between the series connected MOSFET devices in the output buffer have been found to drift, especially when the output voltage $V_{out}$ is transitioned. Compensation device 42 prevents the devices M7–M8 from being overly stressed in the manner described below, so as to avoid failure of the individual devices and the output buffer 40 itself.

Describing now the operation of output buffer 40, when the supply voltage $V_{yf}$ is a relatively high voltage, i.e., greater than 20 volts, the voltages of bias lines $V_{b1}$ and $V_{b2}$ are predetermined in accordance with the principles set forth in the '629 patent. Thus, for the output buffer 40 shown in FIG. 4 as having two P- and two N-channel devices connected in series, the bias voltages on bias lines $V_{b1}$ and $V_{b2}$ are set approximately to 0.5 $V_{yf}$. As a result, when control lines CTRL1 and CTRL2 receive a logic 1 signal, for example, devices M9 and M10 will turn on and devices M7 and M8 will turn off, thereby causing the output voltage $V_{out}$ to be pulled down to the $V_{ss}$ rail. In such a case, the reverse bias voltage across the two P-channel devices M7 and M8 will be approximately equal to 0.5 $V_{yf}+V_t$, as is described above. Alternatively, if a logic 0 signal is applied to the control lines CTRL1 and CTRL2, devices M9 and M10 will turn off and devices M7 and M8 will turn on, such that the output voltage $V_{out}$ will be pulled up to the supply voltage $V_{yf}$ rail. In such case, the supply voltage $V_{yf}$ will be substantially equally distributed across devices M9 and M10 rather than devices M7 and M8.

During the operation of prior art output buffers of a type like the output buffer 40, voltage drift has tended to occur at one or more nodes between the series connected MOSFET devices. For example, it is believed that the voltage drift at the node designated N2 is brought on, at least in part, by an output feedback effect which couples through the parasitic capacitance of the drain of device M8. More specifically, the parasitic capacitance $C_{gd}$ between the gate and drain of device M8 (shown in phantom in FIG. 4), causes what is referred to as output feedback to occur when the output voltage $V_{out}$ changes from the value of $V_{yf}$ to that of $V_{ss}$. This happens, for example, when the applied voltage on control lines CTRL1 and CTRL2 goes from a logic 0 to a logic 1 state as is detailed above. When the output voltage $V_{out}$ changes from the value of $V_{yf}$ to that of $V_{ss}$, a rapid, relatively large voltage change is experienced at the drain of device M8, which is then coupled through the parasitic capacitance $C_{gd}$ to the gate of device M8. This voltage surge, which oftentimes is greater than the applied bias voltage on bias line $V_{b1}$ and acts to decrease the voltage on the bias line $V_{b1}$. As a result of the decreased bias voltage, device M8 is turned on more heavily than it would be were the voltage on the bias line $V_{b1}$ to remain constant. Node N2 is therefore discharged to a low potential (approximately the minimum transient value of $V_{b1}+V_t$), which can result in an unreasonably large reverse bias voltage occurring across device M7, possibly exceeding its reverse bias breakdown voltage. Such a stress can eventually lead to the failure of device M7. Furthermore, once device M7 fails, the entire circuit 40 could follow.

In the preferred embodiment, the present invention utilizes the compensation device 42 in the output buffer 40 to reduce the effects of output feedback by reducing the magnitude of the voltage coupled onto the bias lines $V_{b1}$ and $V_{b2}$. Furthermore, the present invention utilizes the compensation device 42 to recharge node N2 to its appropriate potential in the event such potential is discharged undesirably, for example, due to the aforesaid capacitive coupling. In previous output buffers such as those described in the '629 patent, there was no source of current at node N2 provide the necessary charge to recharge node N2 and thereby alleviate the stress on device M7.

FIG. 5A shows an output feedback model which represents the coupling which occurs between the output voltage $V_{out}$ and the voltage on the bias line $V_{b1}$ through the parasitic capacitance $C_{gd}$, as is described above.

The voltage on the bias line $V_{b1}$ can be described by the following equation:

$$V_{b1}(t) = V_p * \exp(-t/W_O) + V_{b1\phi},$$

where
$W_O = 1/(R_{BO} * C_{gd})$,
$R_{BO}$ is the output impedance of the bias generator;
$V_p$ is the peak voltage; and
$V_{b1\phi}$ = steady state value of $V_{b1}$, typically approximately 0.5 $V_{yf}$.

Figure 5B:
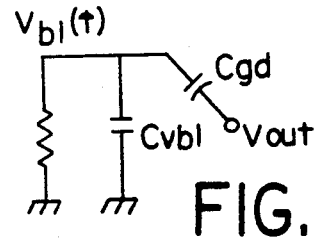

In the preferred embodiment, the compensation device 42 includes a shunt capacitor $C_{vb1}$ between the bias line $V_{b1}$ and ground $V_{ss}$ to reduce the peak voltage $V_p$ which is coupled through to the gate of device M8 as is shown in FIG. 5B. Using the shunt capacitor $C_{vb1}$, the feedback model may be described as follows:

$$V_{b1}(t) = \frac{V_p}{1 + \frac{C_{vb1}}{C_{gd}}} \exp(-t/W_1) + V_{b1\phi},$$

where
$W_1 = 1/[R_{bo}(C_{vb1} + C_{gd})]$

The addition of the shunt capacitor $C_{vb1}$ between bias line $V_{b1}$ and digital ground $V_{ss}$ therefor reduces or eliminates the effects of any output feedback caused by the parasitic capacitance $C_{gd}$ of MOSFET device M8. Should the output feedback present a rapid change in the voltage on the bias line $V_{b1}$, the voltage change will be shunted to ground and, as a result, device M8 will not be turned on so heavily, if at all. Instead, the voltage on the bias line $V_{b1}$ will preferably remain at its desired value as is described above. Moreover, while the shunt capacitor $C_{vb1}$ is described in the preferred embodiment as being tied to $V_{ss}$, it will be apparent that in alternate embodiments, $C_{vb1}$ can be tied to $V_{vf}$ or any low impedance power supply.

In the preferred embodiment, the compensation device 42 further includes circuitry for recharging node N2 to its appropriate potential (approximately 0.5 $V_{vf} + V_t$ in the described exemplary embodiment), in the event it is discharged to a low potential due to output feedback. The compensation device 42 serves as a current source which provides additional charge to node N2 such that the node is returned to its appropriate potential. In the preferred embodiment, the compensation device 42 utilizes a diode or bipolar transistor for providing charge to node 2. In most of today's standard CMOS processes, diodes and bipolar transistors are inherently present in the CMOS chip where various p-n-p or n-p-n junctions are formed. Thus, the present invention may be implemented using most standard CMOS processes. However, other embodiments may use other current or charge sourcing devices, using standard or non-standard CMOS processes, without departing from the intended scope of the present invention. While it is preferred that standard CMOS processes be utilized, it will be apparent to one of ordinary skill that various devices and/or processes may be utilized to reduce or to eliminate coupling on the bias lines as well as voltage drift at the various nodes.

Figure 6:
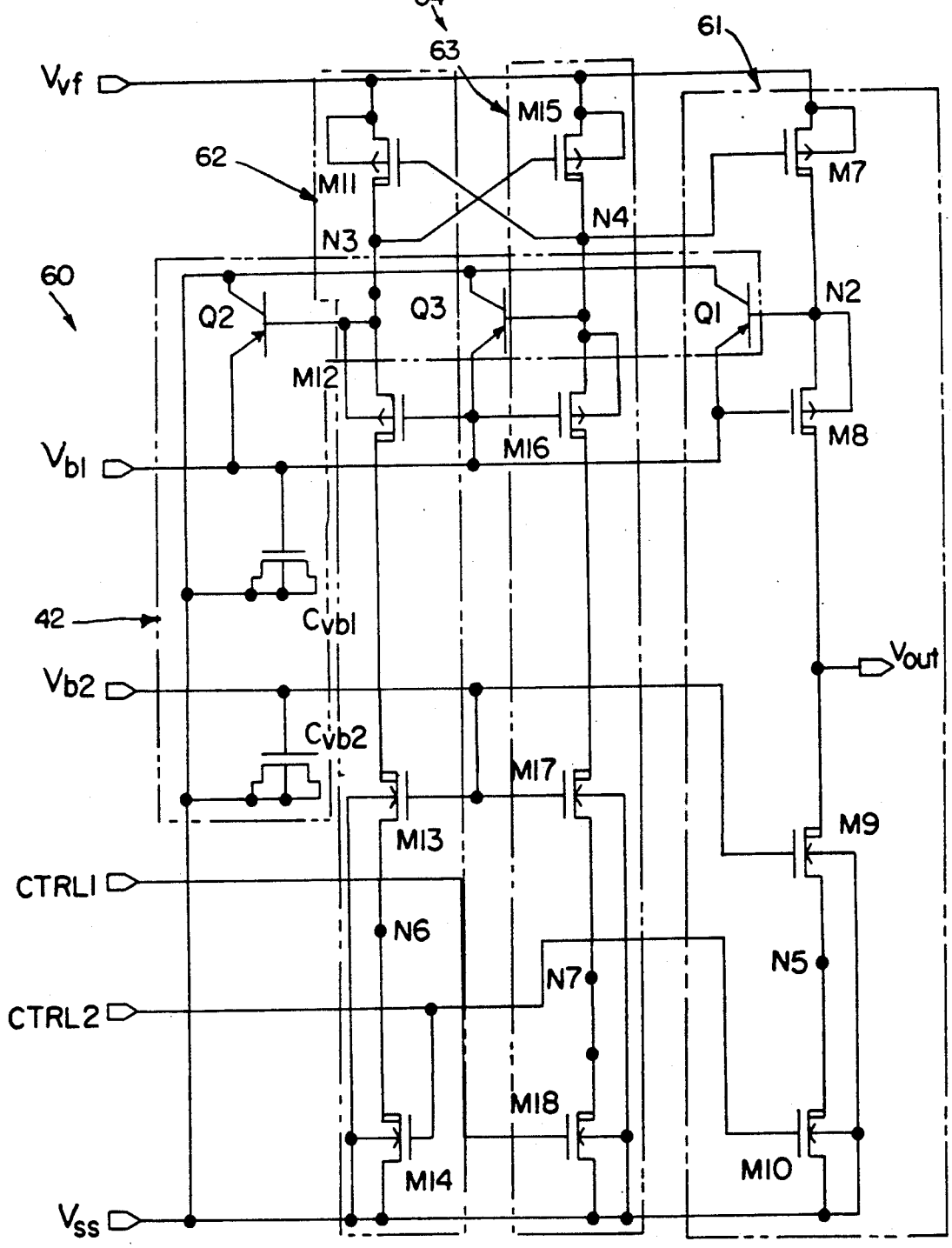
FIG. 6 shows a detailed schematic diagram of a high-voltage driver circuit including a CMOS high voltage push-pull output buffer with circuitry which compensates for voltage drift in accordance with the present invention.

FIG. 6 shows a detailed schematic diagram of a highly stable high voltage driver circuit 60 including a CMOS high-voltage push-pull output buffer 61 using standard CMOS technology in accordance with the present invention. Devices M7-M10 are connected in a series configuration forming the output buffer 61 as is described above, and the bias lines $V_{b1}$ and $V_{b2}$ provide the appropriate bias voltages to the gates of M8 and M9 respectively. Shunt capacitors $C_{vb1}$ and $C_{vb2}$ are respectively located between digital ground $V_{ss}$ and the bias lines $V_{b1}$ and $V_{b2}$. Devices M11-M14 and M15-M18 form two secondary output buffers 62, 63 which serve as a predriver or amplifier 64 between the control inputs CTRL1 and CTRL2 and the output buffer 61 devices M7-M10, which make up the primary output buffer.

Thus, for example, a logic 1 signal of 5 volts on the control line CTRL2 would clearly be sufficient to turn on device M10 in the output buffer 61. However, this same 5 volt signal on the control line CTRL1 would not be sufficient to turn off device M7 as is necessary in order for the output buffer 60 to function properly. Of course, this is due to the fact that the source of device M7 is at the supply voltage $V_{vf}$ which typically would be much greater than the 5 volt input signal. Therefore, devices M11-M18 are used to increase the value of the control inputs to the high-voltage output buffer 61 where necessary.

The predriver or amplifier 64 formed by devices M11-M18 is configured in the form of a cross-coupled inverter stage. As a result, the amplifier does not use as much current as would a traditional amplifier. However, while the preferred embodiment uses such an amplifier, it is not meant to limit the scope of the invention.

In accordance with the preferred embodiment of the present invention shown in FIG. 6, the compensation device 42 includes compensation circuitry for reducing possible voltage drift at nodes N2-N7. It is noted that such voltage drift tends not only to occur at the nodes between the series connected devices M7-M10, but also at the nodes between the series connected devices M11-M18 for one or more of the above described reasons. The compensation device 42 includes shunt capacitors $C_{vb1}$ and $C_{vb2}$ for reducing the peak voltage $V_p$ which ordinarily would tend to be coupled to the bias lines $V_{b1}$ and $V_{b2}$ through devices M8, M12, and M16 (with respect to bias line $V_{b1}$), and devices M9, M13, and M17 (with respect to bias line $V_{b2}$). The shunt capacitors $C_{vb1}$ and $C_{vb2}$ preferably are FET devices connected with their source, drain and substrate each tied to ground and their gate coupled to a respective bias line $V_{b1}$, $V_{b2}$ as is shown in FIG. 6.

Since the shunt capacitors preferably are formed of field effect transistor (FET) devices, and since those FET devices can be formed with the other FET or MOSFET devices of the circuit 60, no special CMOS processes would be necessary to make the shunt capacitors. Alternatively, the shunt capacitors may be made using other monolithic techniques, either standard or non-standard. The above equations preferably are utilized in order to determine the desired capacitance for providing sufficient coupling between the bias lines and ground in a given application, as will be apparent to one of ordinary skill.

In order to recover the voltage at nodes N2, N3 and N4 in the event they are undesirably discharged due to, for example, a swing in the bias line voltage as is described above, the preferred embodiment of the compensation device 42 includes bipolar devices Q1, Q2 and Q3. Thus, for example, when node N2 is discharged to a low potential due to output feedback or the like, device Q1 would turn on causing a charge to build up at node N2 until the voltage at node N2 becomes approximately equal to the bias voltage $V_{b1}$. Similarly, should nodes N3 and N4 be discharged to a low voltage due to parasitic capacitance or the like, devices Q2 and Q3 would serve to charge each respective node back to the appropriate voltage.

In an analogous manner to that which is described above, node N5 (as well as nodes N6 and N7) may also experience voltage drift due to, for example, the output feedback effect which couples through the parasitic capacitance of each respective MOSFET device. More specifically, using device M9 as an example, when output voltage $V_{out}$ changes from that of digital ground $V_{ss}$ to the supply voltage $V_{vf}$, the transitioning output voltage will couple through the parasitic capacitance $C_{gd}$ to the gate of device M9. As is described above, this coupled voltage will cause a swing in the bias line voltage $V_{b2}$, causing device M9 to turn on heavily, and thus causing node N5 to be pulled up to an undesirably high level, As a result, a large voltage or stress is placed across device M10.

As is described above, shunt capacitor $C_{vb2}$ helps to slow down or to eliminate the effects of such undesirable output feedback by reducing or eliminating swing in the bias line voltage. Moreover, by carefully timing the application of the control signals on control lines CTRL1 and CTRL2 during a switching operation, it is possible to shut off device M10 and turn on device M7 such that node N5 may properly charge up to avoid the voltage stress on the gate of device M9. This enables the effects of voltage stress to be avoided at nodes N5, N6 and N7 in the output buffer 60.

Alternatively, the compensation device 42 may also include a bipolar transistor or the like which is configured to remove excess charge from node N5. For example, the compensation device 42 may include a bipolar transistor which is configured in a complementary fashion to that of Q1. Thus, the bipolar transistor will discharge excess charge from node N5 until the voltage at node N5 becomes approximately equal to the bias line $V_{b2}$ voltage.

In addition to reducing or eliminating the effects of voltage drift and/or swing in the bias line voltages in the output buffer 61, the preferred embodiment of the present invention offers enhanced performance of the output buffer 61 under low $V_{vf}$ conditions. This is accomplished in part by utilizing separate bias lines $V_{b1}$, $V_{b2}$ for biasing each MOSFET device in the corresponding pair.

In the past, a single bias line has been utilized to provide the desired bias voltage to a corresponding pair of MOSFET devices as is described above. For example, the above mentioned '629 patent teaches a single fixed bias line $V_{bb} = 0.5 V_{vf}$ for biasing corresponding devices M4 and M5 as is shown in FIG. 3. Because the bias voltage applied to the devices in the corresponding pair were equal, a single bias line was sufficient.

The present invention utilizes separate bias lines $V_{b1}$ and $V_{b2}$ rather than the single line $V_{bb}$ for providing the bias voltages to the corresponding P and N-channel devices M8 and M9. The present invention utilizes separate bias lines such that the gate voltages on corresponding P and N-channel devices in the series connected stack may be controllably optimized both under low and high supply voltage $V_{vf}$ conditions. As a result, the performance of the output buffer at low voltage conditions is comparable to that at high voltage conditions.

The preferred embodiment of the present invention is designed in such a manner that the bias voltages on the respective bias lines to the buffers 61–63 are switched in the event the supply voltage $V_{vf}$ drops below a predetermined reference voltage. Specifically, by switching the applied bias voltages when the supply voltage $V_{vf}$ passes through a reference voltage, $V_{switch}$, the performance of the buffers is enhanced as is described in detail below.

In order to predetermine the reference voltage $V_{switch}$, one must take into account the critical voltage of the MOSFET devices. The critical gate voltage ($V_{crit}$) for a given MOSFET device may be defined as the applied gate voltage at which reliability problems may occur in the MOSFET device. More specifically, $V_{crit}$ is the maximum value of $V_{vf}$ at which the bias voltage to the device can change. Therefore, the described invention preferably is designed such that the above-mentioned switching voltage $V_{switch}$ is a voltage below $V_{crit}$. Otherwise, the precise value of $V_{switch}$ is limited only by circuit operation constraints.

In the event the supply voltage $V_{vf}$ is greater than or equal to $V_{switch}$, the bias lines in the present invention are preferably automatically set such that $V_{b1} = V_{b2} = 0.5 V_{vf}$, which would be the appropriate bias voltage for the single bias line as is taught in the '629 patent. In the event, however, that the supply voltage $V_{vf}$ is lower than the predetermined voltage $V_{switch}$, the bias lines in the present invention are set such that $V_{b1} = 0$ V and $V_{b2} = V_{vf}$ volts.

Thus, in the high-voltage driver circuit, shown in FIG. 6, when the control line CTRL2 receives a logic 1 and CTRL1 receives a logic zero signal and the supply voltage $V_{vf}$ is greater than or equal to $V_{switch}$, devices M7 and M8 are turned off and devices M9 and M10 are turned on. The bias voltage on bias line $V_{b2} = 0.5 V_{vf}$ provides an applied gate to source voltage of approximately $0.5 V_{vf}$, which would sufficiently bias devices M9 and M10 to conduct the necessary current. However, in the event that the supply voltage $V_{vf}$ is less than the switching voltage $V_{switch}$, the bias line values are automatically switched to $V_{b1} = 0$ V and $V_{b2} = V_{vf}$ in order to maximize the applied gate to source voltages of the P- and N-channel devices. By maximizing the applied gate to source voltages on the respective devices, the conductivity of the devices when on is increased, and therefore the sourcing ability and switching speed of the output buffer is also increased as will be appreciated. As an example, if a logic 1 signal were applied to the control line CTRL2 and logic zero on CTRL1, both devices M7 and M8 turn off and devices M9 and M10 turn on. In the situation where the supply voltage $V_{vf}$ is less than the switching voltage $V_{switch}$, the entire supply voltage $V_{vf}$ is applied to the gate of device M9 such that the gate to source voltage is approximately the entire value of the supply voltage $V_{vf}$, thus turning on device M9 as heavily as possible. Hence, the use of separate bias lines in the present invention allows differing voltages to be applied to corresponding P- and N-channel device pairs in the series connected stack, thus enhancing the current driving ability of the output buffer 61 in low supply voltage $V_{vf}$ applications, and thereby reducing the size and cost of the overall circuit 60, especially output buffer 61, as well as increasing the speed.

Figure 7:
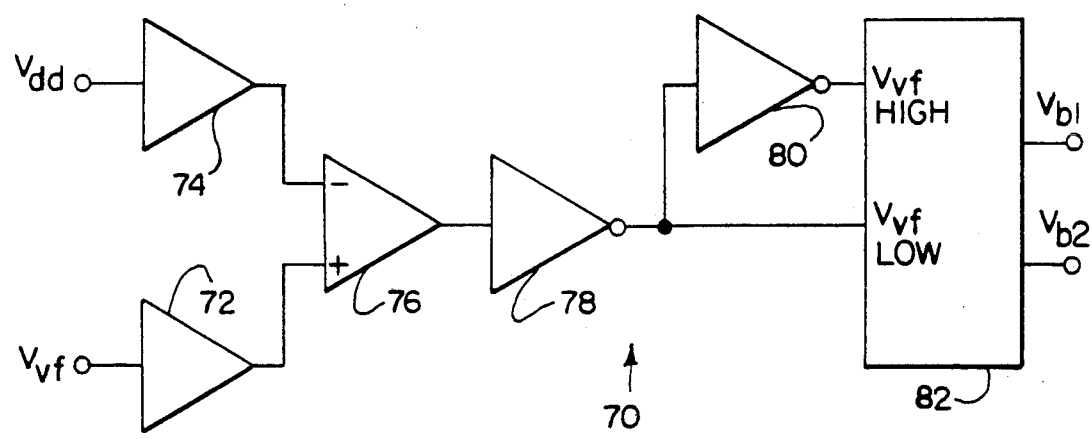
FIG. 7 is a block diagram of a bias generator in accordance with the invention.

In order that the high-voltage output buffer 61 described above may perform substantially as well under low supply voltage $V_{vf}$ conditions as it does under high supply voltage $V_{vf}$ conditions, a self-adjusting bias generator 70, as shown in FIG. 7, is utilized to provide the desired bias voltages to bias lines $V_{b1}$ and $V_{b2}$. As was previously described above, the current sourcing ability of the individual MOSFETs in the output buffer 61 suffered in the past when the supply voltage $V_{vf}$ dropped below a particular voltage, for example, 11 volts. The present invention utilizes a self-adjusting bias generator 70 to vary the applied bias voltages in the event the supply voltage $V_{vf}$ falls below a predetermined value. By changing the magnitude of the applied bias voltages to the output buffer under low supply voltage $V_{vf}$ conditions, the performance of the output buffer 61 is enhanced. For example, the response time of the output buffer 61 is improved and the noise on the respective bias lines is reduced.

The self-adjusting bias generator 70 in the exemplary embodiment provides appropriate bias line voltages which make up a first output state under those conditions where the supply voltage $V_{vf}$ is high. Alternatively, when the supply voltage $V_{vf}$ is relatively low, the bias generator will automatically adjust the bias line voltages to correspond to what is referred to as a second output state Referring now to FIG. 7, shown is a self-adjusting bias generator 70 for providing the appropriate bias voltages on bias lines $V_{b1}$ and $V_{b2}$ to the above described high-voltage output buffer 61, as well as the remainder of the overall circuit 60. The bias generator 70 automatically adjust the bias voltage provided on each bias line as a function of the value of the supply voltage $V_{vf}$. The bias generator 70 includes a pair of scalers 72 and 74. The scalers 72 and 74 provide scaled values of the supply voltages $V_{vf}$ and $V_{dd}$, respectively, to comparator 76.

The outputs of the scalers are compared by the comparator 76. The output of the comparator 76 is then processed through a low voltage inverter 78 and a high voltage inverter 80, the respective outputs of which control the switching network 82. In the preferred embodiment, when the output of the high voltage inverter 80 is high (thereby indicating normal or high $V_{vf}$ conditions), the switching network 82 causes $V_{b1} = V_{b2} = 0.5$ $V_{vf}$. When the output of the low voltage inverter 78 is high (thereby indicating low $V_{vf}$ conditions), the switching network 82 causes the bias voltages on the bias lines $V_{b1}$ and $V_{b2}$ to assume a second output state wherein $V_{b1} = V_{ss}$ and $V_{b2} = V_{vf}$.

Figure 8:
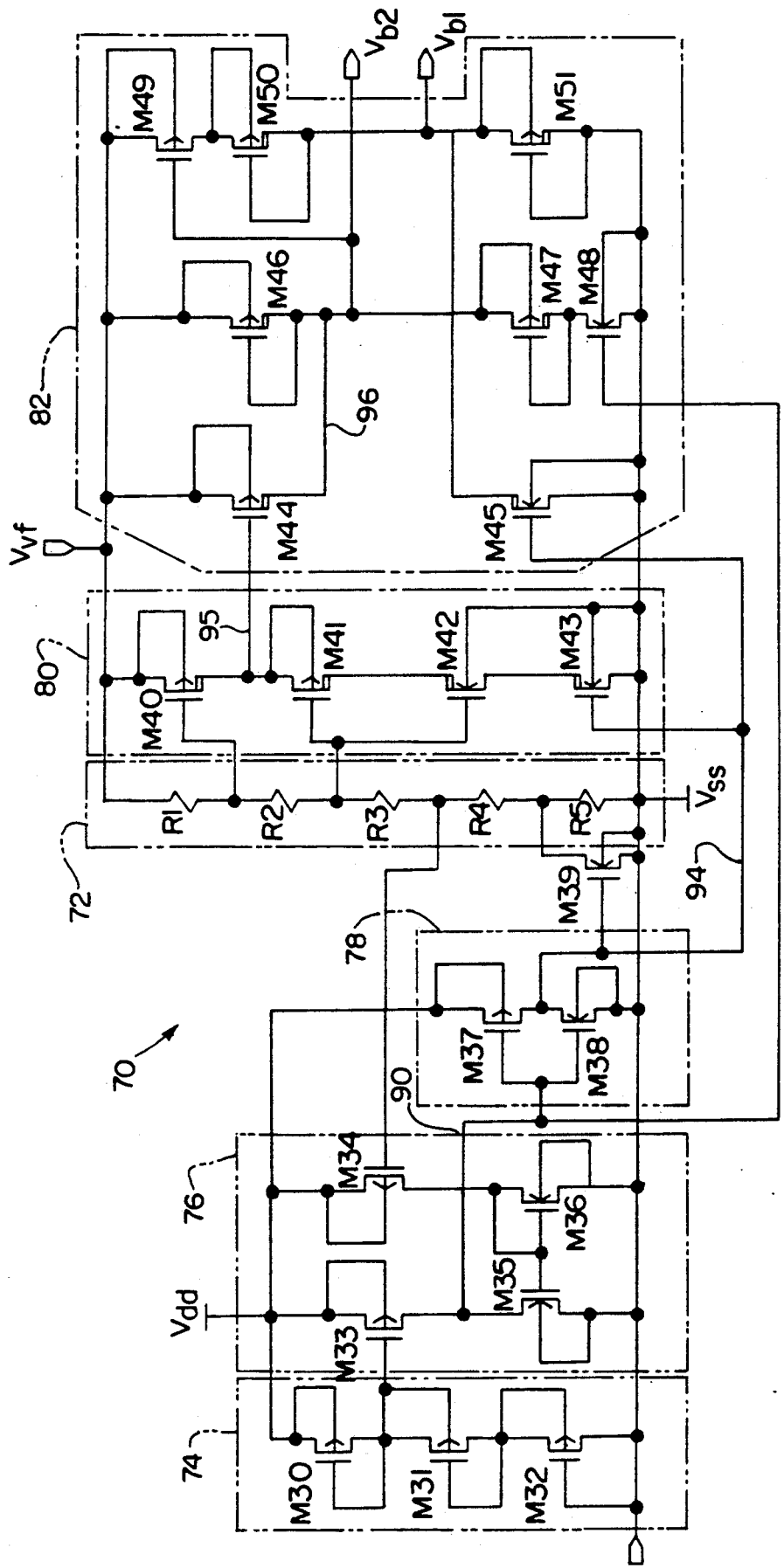
FIG. 8 is a detailed schematic circuit diagram of the bias generator of FIG. 7.

FIG. 8 shows a detailed diagram of an exemplary embodiment of the self-adjusting bias generator 70. The bias generator 70 again includes a supply voltage $V_{vf}$ scaler 72 (R1-R5), a standard supply voltage $V_{dd}$ scaler 74 (M30-M32), a comparator 76 (M33-M36), a low voltage inverter 78 (M37-M38), a high voltage inverter 80 (M40-M43) and a voltage switching network 82 (M44-M51).

With respect to the operation of switching network 82, when the supply voltage $V_{vf}$ is high (e.g., greater than 11 volts), devices M48 and M49 will be on while devices M44 and M45 are off. As a result, the supply voltage $V_{vf}$ is substantially equally divided across devices M46 and M47, producing a bias line output voltage of $V_{b2} = 0.5$ $V_{vf}$. Devices M46 and M47 are configured as a pair of stacked, self biased MOSFETs forming a voltage divider. In the Exemplary embodiment, both devices M46 and M47 are equally sized such that the supply voltage $V_{vf}$ is equally divided therein. Similarly, the supply voltage $V_{vf}$ is also substantially equally divided across devices M50 and M51, thereby producing a bias line voltage on bias line $V_{b1}$ of $V_{b1} = 0.5$ $V_{vf}$.

In the event the supply voltage $V_{vf}$ is low (e.g., less than 11 volts), device M45 will turn on and will therefore causes bias line $V_{b1}$ to be pulled down low to the $V_{ss}$ rail (or digital ground). Device M44 will also turn on and will cause bias line $V_{b2}$ to be pulled high to the supply voltage $V_{vf}$ rail. Under such low suppply voltage $V_{vf}$ conditions, devices M48 and M49 will remain off. Thus, the voltage switching network 82 is capable of switching the voltages on bias lines $V_{b1}$ and $V_{b2}$ between a first output state where $V_{b1}32$ $V_{b2} = 0.5$ $V_{vf}$, and a second output state where $V_{b1} = V_{ss}$ and $V_{b2} = V_{vf}$.

In the exemplary embodiment shown in Fig. 8, the resistor R1-R5 in the supply voltage scaler 72 form a resistive divider which provides a scaled value of the supply voltage $V_{vf}$ which is input into the comparator 76. In addition, a scaled value of the supply voltage $V_{dd}$ is derived from the voltage scaler 74 and is similarly input into the comparator 76. The voltage scaler 74 comprises a stacked of self-biased MOSFET devices M30-M32 which are sized to provide the desired scaled voltage of the supply voltage $V_{dd}$.

The scaled value of the supply voltage $V_{vf}$ is input to the gate of device M34, and the scaled value of the supply voltage $V_{dd}$ is input to the gate of device M33; the gates of these devices serving as the inputs to the comparator 76. The comparator 76 compares the relative values of the supply voltages $V_{vf}$ and $V_{dd}$. The scaled value of the supply voltage $V_{vf}$ generates a current in devices M34, which is mirrored by device M36 into device M35. The scaled value of the supply voltage $V_{dd}$ generates a current in device M33. Should the scaled value of the supply voltage $V_{vf}$ be larger than that of the standard supply voltage $V_{dd}$, the current in device M35 will be less than that in device M33, so the output of the comparator will rise until the two currents are equal. This output, designated line 90, thus provides a valid high level. Output line 90 therefore causes device M48 to turn on. In addition, the voltage on output line 90 also serves as the input voltage into the low voltage inverter 78 which may consist of a standard CMOS inverter as is shown. When the signal on line 90 is high, then line 94, which represents the output of the low voltage inverter 78, will be low, thus resulting in device M45 being off.

In addition, line 94 also coupled to the gate of device M43 which serves as the input to the high voltage inverter 80. Thus, when the scaled value of the supply voltage $V_{vf}$ is greater than that of $V_{dd}$, the high voltage inverter 80 inverts the low signal at the input gate of device M43 and provides a high signal at its output which is designated as line 95. The high signal on line 95 causes device M44 to turn off. With device 48 being on and device M44 being off, the supply voltage $V_{vf}$ is substantially evenly divided across devices M46 and M47, as is described above. As a result, the voltage on the line designated line 96 remains at approximately 0.5 $V_{vf}$. Therefore, device M49 is turned on. Moreover, because device M45 is off, the supply voltage $V_{vf}$ is substantially evenly divided across devices M50 and M51, as is described above. As a result, the voltages on bias lines $V_{b1}$ and $V_{b2}$ assume a first output state where $V_{b1} = V_{b2} = 0.5$ $V_{vf}$ as is described above.

It may be noted that the high voltage inverter 80 is utilized in order to increase the voltage applied to the gate of device M44 such that the voltage at the gate will be sufficient in such instance to prevent device M44 from turning on. As will be apparent to one of ordinary skill, the source of device M44 is at the relatively high potential of the supply voltage $V_{vf}$ and a large gate voltage is necessary to prevent the device from turning on. Since the typical signals utilized in the CMOS circuit are approximately 5 volts, a larger signal is obtained by use of the high voltage inverter 80.

In the event the scaled value of the standard supply voltage $V_{vf}$ is lower than that of the supply value $V_{dd}$, the current in the device M35 will be greater than that in device M33, so the output of the comparator will fall until the two currents are equal. The output of the comparator at line 90 is thereby driven low, which in turn will cause device M48 to turn off. The signal on line 90 is inverted by the low voltage inverter 78, resulting in the output of the low voltage inverter 78 on line 94 going high and turning on device M45. The high signal on line 94 is inverted by the high voltage inverter which causes the signal on line 95 to go low, and thus device M44 turns on which pulls the voltage on the bias line $V_{b2}$ up to the supply voltage $V_{vf}$. Furthermore, with device M45 being on, the bias line $V_{b1}$ is pulled down to digital ground $V_{ss}$ as is described above. Therefore, in the event $V_{vf}$ is lower than the predetermined scaled value of $V_{dd}$, the bias voltages provided on the bias lines $V_{b1}$ and $V_{b2}$ will automatically assume a second output state wherein $V_{b1}=V_{ss}$ and $V_{b2}=V_{vf}$.

In the preferred embodiment shown in FIG. 8, resistors R1–R5 function not only to scale the value of the supply voltage $V_{vf}$, but also serve to provide appropriate bias voltages to the high voltage inverter 80. Device M39, which bypasses resistor R5, allows a small amount of supply voltage $V_{vf}$ hysteresis for switching the bias line voltages (approximately 1 volt in the preferred embodiment).

Thus, in the case where the supply voltage $V_{vf}$ is determined by the bias generator 70 to be sufficiently large to allow for the normal operation of the output buffer 60 (i.e., the gate to source voltage $V_{gs}$ is sufficient in each device), the bias generator 70 automatically provides equal bias voltages of $V_{b1}=V_{b2}-0.5\ V_{vf}$. These bias voltages are each provided, respectively, by the voltage dividers formed by devices M50–M51 and M46–M47. In the case where the supply voltage $V_{vf}$ is determined not to be sufficiently large so as to allow for satisfactory operation with said first output state bias line voltages, devices M45 and M44 pull the bias lines to the supply voltage $V_{vf}$ and digital ground $V_{ss}$ rails, respectively. These bias line voltages form the second output state.

One aspect of the present invention is that under such low supply voltage $V_{vf}$ conditions, the maximum bias voltage is presented by the bias generator to the respective MOSFET devices. As is described above, this increases the current sourcing ability of the devices in addition to their speed.

An additional advantage is that the bias generator 70 attempts to balance the effects of noise on the bias lines with the amount of current which the bias generator 70 draws. More specifically, at low voltage levels where noise can have a more significant effect, the bias generator 70 utilizes a low impedance source, i.e., the $V_{vf}$ and $V_{ss}$ rails, to provide the desired bias voltages. Such a low impedance source offers a route for noise on the bias line to be shunted off the bias line. Under low supply voltage $V_{vf}$ conditions, traditional stacked MOSFETs may be used to provide the desired bias voltages, but this would require larger devices to provide the required low impedance. These larger devices would substantially increase the current requirement of bias generator 70 under high $V_{vf}$ conditions. Using the $V_{vf}$ and $V_{ss}$ rails as the low impedance bias sources uses no $V_{vf}$ current under low $V_{vf}$ conditions, and so the stacked MOSFETs used in high $V_{vf}$ conditions require no more current than necessary.

Still another advantage offered by the present invention is that the bias generator 70, as well as the output buffer 61, may be manufactured using standard CMOS processes. Elaborate manufacturing techniques are not required, thus resulting in a lower cost.

It is to be understood that the present invention is not limited to the embodiments described, and that other modifications may be made without departing from the spirit and scope of the invention. For example, while the above described self-adjusting bias generator 70 is designed to switch bias line voltages at approximately $V_{vf}=11$ volts, the bias generator 70 may be designed to switch at some other voltage without departing from the scope of the invention. By simply varying the scaling ratio of scalers 72 and 74, one may design the bias generator 70 to switch bias voltages at some other fractional value of supply voltage $V_{vf}$. A switching voltage of 11 volts is utilized herein since the particular application will normally operate at a value of $V_{vf}$ greater than 11 volts, and so under normal operation the bias voltages will not be switching states. However, the switching voltage $V_{switch}$ should not be set so high as to fail to adequately protect the MOSFET devices in the output buffer 61 from being subjected to large voltages and the stress problems described above.

Similarly, while the preferred embodiment discloses a self-adjusting bias generator 70 having one set of separate bias lines, another embodiment may include additional sets in which the bias line voltages also are switched between a first and second output state, depending on the value of the supply voltage $V_{vf}$. For example, for a high-voltage output buffer 61 having three or more P-channel devices connected in series with corresponding N-channel devices, a self-adjusting bias 70 generator may be utilized to provide multiple sets of switchable bias voltages to the corresponding devices.

While the present invention is described with reference to a particular embodiment, the invention is not limited to the specific examples given, and other embodiments and modifications can be made by those skilled in the art without departing from the spirit and scope of the invention. It will be appreciated that the scope of the invention is determined by the claims and equivalents thereof.

For example, while the output buffers shown in FIGS. 4 and 6 utilize a series configuration of two P- and two N-channel devices, in view of the present invention it will be appreciated by one of ordinary skill in the art that any number of P- and N-channel devices may be similarly connected in series such that the high supply voltage $V_{vf}$ is preferably substantially evenly distributed across either the P- or N-channel devices. Likewise, the present invention may include multiple sets of separate bias lines, each set biasing an appropriate corresponding pair of MOSFET devices. While the voltage on each bias line in the set is equal under normal supply voltage $V_{vf}$ conditions, the voltage on each bias line may be adjusted to maximize performance under low supply voltage $V_{vf}$ conditions.

In addition, the inventive aspects of the compensation device 42 need not be limited to use in a high-voltage output buffer, but may also be included in various other circuits or applications in which a two or more MOSFET or other type devices are connected in series and are subjected to a high voltage being switched across one or more of their outputs.

What is claimed is:

1. A self-adjusting bias generator, comprising:
  a plurality of bias line outputs, each of which provides a bias voltage thereat; and automatic means for adjusting at least one of said bias voltages in a stepwise manner between a first output state and a second output state based on the magnitude of a reference voltage.

2. The bias generator of claim 1, wherein said reference voltage is a supply voltage applied to said bias generator.

3. The bias generator of claim 1, wherein said automatic means is capable of adjusting a plurality of said bias voltages between a respective first output state and second output state.

4. The bias generator of claim 3, wherein said plurality of bias voltages in a first output state are substantially equal, and plurality of bias voltages in a second output state are substantially different.

5. A self-adjusting bias generator comprising:
a plurality of bias line outputs, each of which provides a bias voltage thereat;
means for comprising a first reference voltage to a second reference voltage; and
automatic means for adjusting at least one of said bias voltages between a first output state and a second output state based on said comparison.

6. The bias generator of claim 5, wherein said first reference voltage comprises a first supply voltages applied to said bias generator, and said second reference voltage comprises a second supply voltage.

7. A self-adjusting bias generator, said bias generator comprising:
a plurality of bias line outputs, at least one of which is capable of assuming one or more different bias levels representing different respective output states; and
automatic means for adjusting the bias voltage on said at least one bias line in a stepwise manner between said different output states based on the magnitude of a reference voltage.

8. The bias generator of claim 7, wherein said reference voltage comprises a supply voltage applied to said bias generator.

9. A self-adjusting bias generator, said bias generator comprising:
a plurality of bias voltage outputs, at least one of which is capable of assuming one or more different bias levels representing different respective output states;
means for comparing a first reference voltage to a second reference voltage; and
means for switching said bias level on said at least one bias voltage output to a level representing a first state when said first reference voltage is greater than said second reference voltage, and for switching said bias level to level representing a second state when said first reference voltage is less than said second reference voltage.

10. The bias generator of claim 9, wherein said plurality of bias voltage outputs comprises a first and a second bias voltage output, each of which is capable of assuming at least two different bias levels.

11. The bias generator of claim 10, whereby when said first and second bias voltage outputs are concurrently in a first state, said bias levels on each of said first and second bias voltage outputs are substantially equal to each other.

12. The bias generator of claim 11, whereby when said first and second bias voltage outputs are concurrently in a second state, said bias levels on each of said first and second bias voltage outputs are substantially different.

13. The bias generator of claim 9, wherein said bias output level representing a first state is provided from a high impedance source, and wherein said bias output level representing a second state is provided from a low impedance source.

14. A high-voltage CMOS push-all output buffer, comprising:
a plurality of P-channel transistors and a plurality of N-channel transistors connected in series with an output at a node formed between two of said transistors connected in series;
separate bias lines for coupling a bias voltage to respective gates of corresponding P-channel and N-channel pair of transistors in said series connected transistors; and
a self-adjusting bias generator, said bias generator comprising plural bias voltage outputs for providing, respectively, said bias voltages to said bias lines, and automatic means for adjusting the magnitude of a least one of said bias voltages between a first output state and a second output state.

15. The output buffer of claim 14, further comprising compensation means for reducing voltage drift at a node located between said transistors connected in series.

16. The output buffer of claim 15, wherein said compensation means comprises at least one means for charging a node experiencing voltage drift back to an appropriate potential and means for decreasing a feedback voltage between a gate and drain of at least one of said transistor connected in series.

17. A high-voltage CMOS push-pull output buffer, comprising:
a plurality of P-channel transistors and a plurality of N-channel transistors connected in series with an otuput at a node formed between two of said transistors connected in series;
separate bias lines for coupling a bias voltage to respective gates of a corresponding P-channel and N-channel pair of transistors in said series connected transistors; and
a self-adjusting bias generator, said bias generator comprising plural bias voltage outputs for providing, respectively, said bias voltages to said bias lines and automatic means for adjusting the magnitude of at least one said bias voltages between a first output state and a second output state; and
wherein said adjusting between said first output state and said second output state is dependent upon the magnitude of a reference voltage.

18. The output buffer of claim 17, wherein said reference voltage is a supply voltage applied to said output buffer.

19. A high-voltage CMOS push-pull output buffer, comprising:
a plurality of P-channel transistors and a plurality of N-channel transistors connected in series with an output at a node formed between two of said transistors connected in series;
separate bias lines for coupling a bias voltage to the respective gates of a corresponding P-channel and N-channel pair of transistors in said series connected transistors;
a self-adjusting bias generator, said bias generator comprising plural bias voltage outputs for providing, respectively, said bias voltages to said bias lines, at least one of said bias voltage outputs being capable of assuming one or more different bias levels representing different respective output states;

means for comparing a first reference voltage to a second reference voltage; and means for switching said bias level on said at least one bias voltage output to a level representing a first state when said first reference voltage is greater than said second reference voltage, and for switching said bias level to a level representing a second state when said first reference voltage is less than said second reference voltage.

20. The output buffer of claim 19, wherein said bias level representing a first state is provided from a high impedance source, and wherein said bias level representing a second state is provided from a low impedance source.

21. The output buffer of claim 19, further comprising compensation means for reducing voltage drift at a node located between said transistors connected in series.

22. The output buffer of claim 21, wherein said compensation means comprises at least one of means for charging a node experiencing voltage drift back to an appropriate potential and means for decreasing a feedback voltage between a gate and drain of at least one of said transistors connected in series.

23. A high-voltage CMOS push-pull output buffer, comprising:

a plurality of P-channel transistors and a plurality of N-channel transistors connected in series with an output at a node formed between two of said transistors connected in series;

separate bias lines for coupling a bias voltage to the respective gates of a corresponding P-channel and N-channel pair of transistors in said series connected transistors; and a self-adjusting bias generator, said bias generator comprising plural bias voltage outputs for providing, respectively, said bias voltages to said bias lines, at least one of said bias voltage outputs being capable of assuming or more different bias levels representing different respective output states:

means for comparing a first reference voltage to a second reference voltage;

means for switching said bias level on said at least one bias voltage output to a level representing a first state when said first reference voltage is greater than said second reference voltage, and for switching said bias level to a level representing a second state when said first reference voltage is less than said second reference voltage; and wherein said plurality of bias voltage outputs comprises a first and a second bias output, each of which is capable of assuming at least two different bias levels.

24. The output buffer of claim 23, whereby when said first and second bias voltage outputs are concurrently in a first state, said bias levels on each of said first and second bias voltage outputs are substantially equal to each other.

25. The output buffer of claim 24, whereby when said first and second bias voltage outputs are concurrently in a second state, said bias levels on each of said first and second bias voltage outputs are substantially different.

26. A self-adjusting bias generator, comprising:

a plurality of bias line outputs, each of which provides a bias voltage thereat, automatic means for adjusting at least one of said bias voltages between a first output state and a second output state based on the magnitude of a reference voltage; and wherein said bias voltage in said first output state differs in magnitude from said bias voltage in said second output state by approximately fifty to one hundred percent.

27. A self-adjusting bias generator, comprising:

a plurality of bias line outputs, each of which provides a bias voltage thereat, automatic means for adjusting at least one of said bias voltages between a first output state and a second output state based on the magnitude of a reference voltage; and wherein said reference voltage can vary between 8 and 30 volts.

* * * * *

UNITED STATES PATENT AND TRADEMARK OFFICE
CERTIFICATE OF CORRECTION

PATENT NO. : 5,179,297
DATED : January 12, 1993
INVENTOR(S) : Kelvin K. Hsueh et al.

It is certified that error appears in the above-identified patent and that said Letters Patent is hereby corrected as shown below:

Claim 5, column 19, line 19, change "comprising" to --comparing--.

Claim 6, column 19, line 26, change "voltages" to --voltage--.

Claim 9, column 19, line 54, after "to" insert --a--.

Claim 14, column 20, line 8, change "push-all" to --push-pull--;

and line 14, after "to" insert --the--;

and line 15, after "of" insert --a--.

Claim 16, column 20, line 29, after "one" insert --of--.

Claim 17, column 20, line 40, after "to" insert --the--;

and line 48, after "one" insert --of--.

Claim 23, column 22, line 12, after "bias" insert --voltage--.

Signed and Sealed this

Twenty-third Day of November, 1993

*Attest:*

BRUCE LEHMAN

*Attesting Officer*     *Commissioner of Patents and Trademarks*